United States Patent
Liang et al.

(10) Patent No.: US 8,657,982 B2
(45) Date of Patent: Feb. 25, 2014

(54) METHOD FOR FABRICATING A PROXIMITY SENSING MODULE

(75) Inventors: Yuan-Chen Liang, Tao Yuan Hsien (TW); Chia-Hui Wu, Dalin Township, Chiayi County (TW); Hung-Ta Lee, Taoyuan (TW); Yi-Chun Lin, New Taipei (TW); Li-Chuan Chien, New Taipei (TW); Kuo-Hsiang Hsu, Hukou Township, Hsinchu County (TW)

(73) Assignee: Quanta Computer, Inc., Tao Yuan Hsien (TW)

( * ) Notice: Subject to any disclaimer, the term of this patent is extended or adjusted under 35 U.S.C. 154(b) by 0 days.

(21) Appl. No.: 13/551,041

(22) Filed: Jul. 17, 2012

(65) Prior Publication Data

US 2013/0118676 A1  May 16, 2013

(30) Foreign Application Priority Data

Nov. 15, 2011  (TW) .............................. 100141607 A

(51) Int. Cl.
*B44C 1/17*  (2006.01)
(52) U.S. Cl.
USPC ........... 156/239; 156/230; 156/233; 156/240; 156/250; 156/257; 156/267; 29/825; 29/829

(58) Field of Classification Search
USPC .................... 29/825, 829; 345/173, 174, 175; 361/179, 181
See application file for complete search history.

(56) References Cited

U.S. PATENT DOCUMENTS

| | | | | |
|---|---|---|---|---|
| 5,645,932 A | * | 7/1997 | Uchibori | 428/347 |
| 6,143,116 A | * | 11/2000 | Hayashi et al. | 156/233 |
| 6,262,692 B1 | * | 7/2001 | Babb | 343/895 |
| 6,320,140 B1 | * | 11/2001 | Enomoto | 174/264 |
| 7,681,301 B2 | * | 3/2010 | Rodgers | 29/600 |
| 2008/0180217 A1 | * | 7/2008 | Isabell | 340/10.1 |

* cited by examiner

*Primary Examiner* — John Goff
*Assistant Examiner* — Hannuri L Kwon
(74) *Attorney, Agent, or Firm* — Brinks Gilson & Lione

(57) ABSTRACT

The steps of a method for fabricating a proximity sensing module that is adapted to be attached to a mobile device, include: (a) patterning an upper conductive film to form a patterned conductive film which includes an upper connective pad that is adapted to be electrically connected to a respective contact on a circuit board of the mobile device, and an induced circuit pattern that is electrically connected to the upper connective pad; (b) adhering an adhesive sheet to the patterned conductive film; and (c) forming a through hole in the adhesive sheet such that the upper connective pad is exposed from the through hole.

10 Claims, 10 Drawing Sheets

METHOD FOR FABRICATING A PROXIMITY SENSING MODULE

CROSS-REFERENCE TO RELATED APPLICATION

This application claims priority of Taiwanese application no. 100141607, filed on Nov. 15, 2011.

BACKGROUND OF THE INVENTION

1. Field of the Invention

This invention relates to a method for fabricating a proximity sensing module, and more particularly to a method for fabricating a proximity sensing module that is adapted to be attached to an inner surface of a housing of a mobile device.

2. Description of the Related Art

At present, a mobile device, for example, a mobile phone, a tablet computer, and the like, is generally provided with a capacitive proximity sensor so that when the approach of a user to the mobile device is detected, the intensity of the electromagnetic wave emitted from the mobile device can be reduced, thereby mitigating the harm of the electromagnetic wave to the user.

Conventionally, a sensing module of a capacitive distance sensor of a mobile device is mounted on a circuit board of the mobile device. The manufacturing process and mounting process of the sensing module of the capacitive distance sensor is relatively complicated. In addition, because the sensing module must have a specific shape to obtain a better sensing effect and because the sensing module must occupy a specific area on the circuit board, the shape of the sensing module and the design of the circuit board must compromise with each other, thereby limiting the design flexibility of the sensing module and the circuit board.

SUMMARY OF THE INVENTION

Therefore, an object of the present invention is to provide a method for fabricating a proximity sensing module that can overcome at least one of the aforesaid drawbacks associated with the prior art.

According to the present invention, there is provided a method for fabricating a proximity sensing module that is adapted to be attached to an inner surface of a housing of a mobile device. The method comprises: (a) patterning an upper conductive film to forma patterned conductive film which includes an upper connective pad that is adapted to be electrically connected to a respective contact on a circuit board of the mobile device, and an induced circuit pattern that is electrically connected to the upper connective pad; (b) adhering an adhesive sheet to the patterned conductive film, the adhesive sheet having an area capable of covering the upper connective pad and the induced circuit pattern; and (c) forming a through hole in the adhesive sheet such that the upper connective pad is exposed from the through hole.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
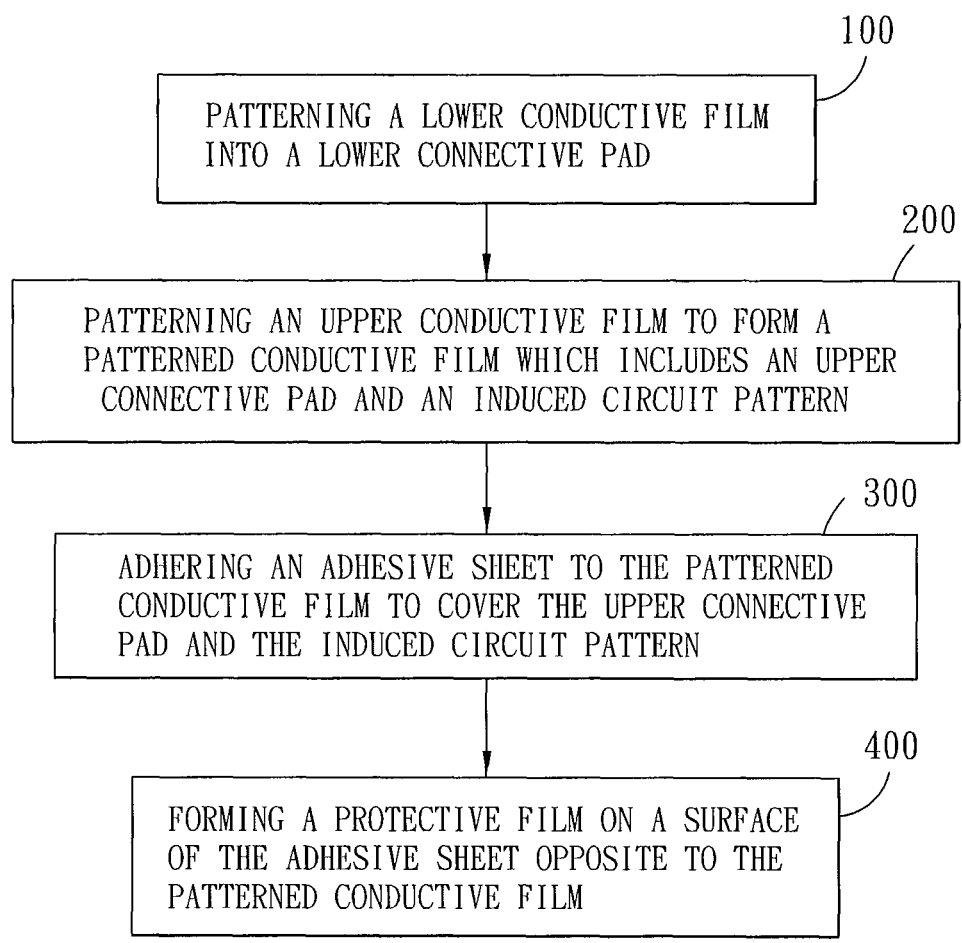
FIG. 1 is a flow chart of the preferred embodiment of a method for fabricating a proximity sensing module according to the present invention.

FIG. 1 shows the preferred embodiment of a method for fabricating a proximity sensing module that is adapted to be attached to an inner surface of a housing 7 (see FIG. 10) of a mobile device according to the present invention. The mobile device may be, for example, a tablet computer, a mobile phone, and the like . The method comprises the steps 100, 200, 300, and 400.

Figure 2:
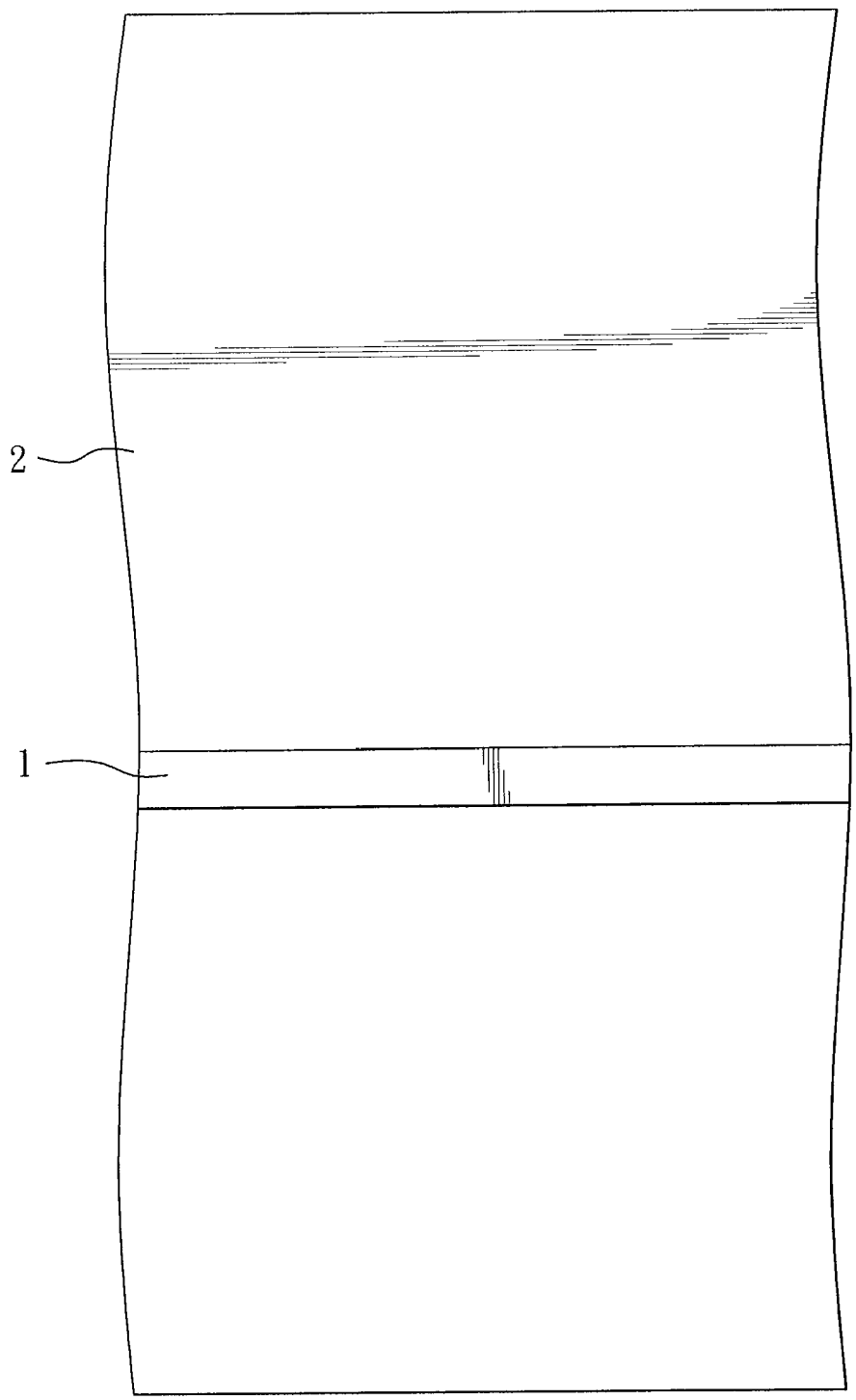
FIGS. 2 and 3 are schematic views illustrating the preparation of a lower connective pad of the preferred embodiment.
Figure 3:
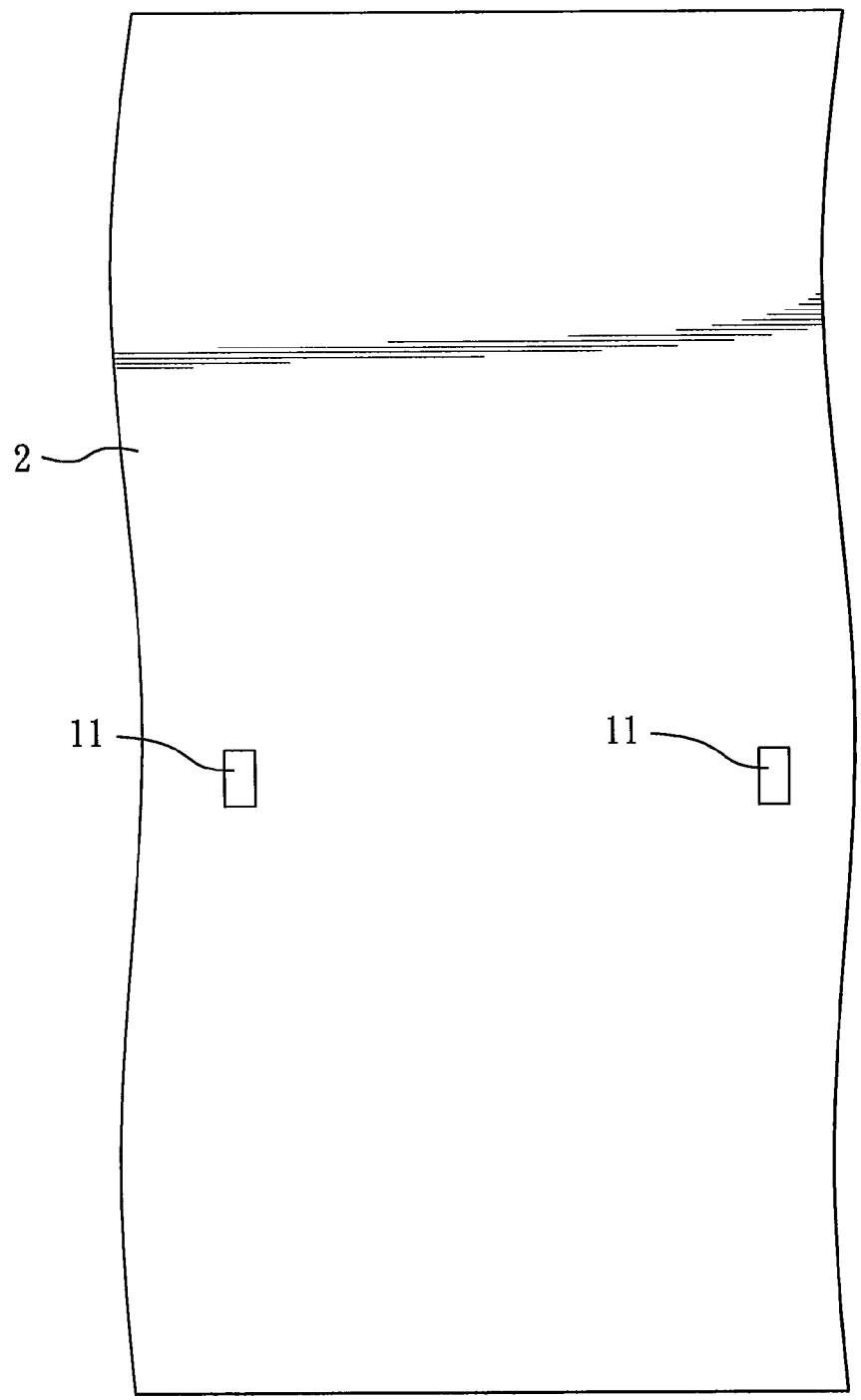

Referring further to FIGS. 2 and 3, in the step 100, an adhesive is applied to a surface of an elongated lower conductive film 1 having a predetermined width, and the lower conductive film 1 is adhered to a release sheet 2 by means of a laminating machine. Next, the lower conductive film 1 is stamped by a press machine, followed by removing an undesired part of the lower conductive film 1 to pattern the lower conductive film 1 into a lower connective pad 11. It is noted that a plurality of spaced apart lower connective pads 11 may be formed simultaneously on the same release sheet 2, and the spacing between the adjacent lower connective pads 11 may be determined by the overall structure of the proximity sensing module. In this manner, the fabrication of a plurality of proximity sensing modules may be conducted simultaneously or continuously in the subsequent steps to increase the fabricating speed.

Figure 4:
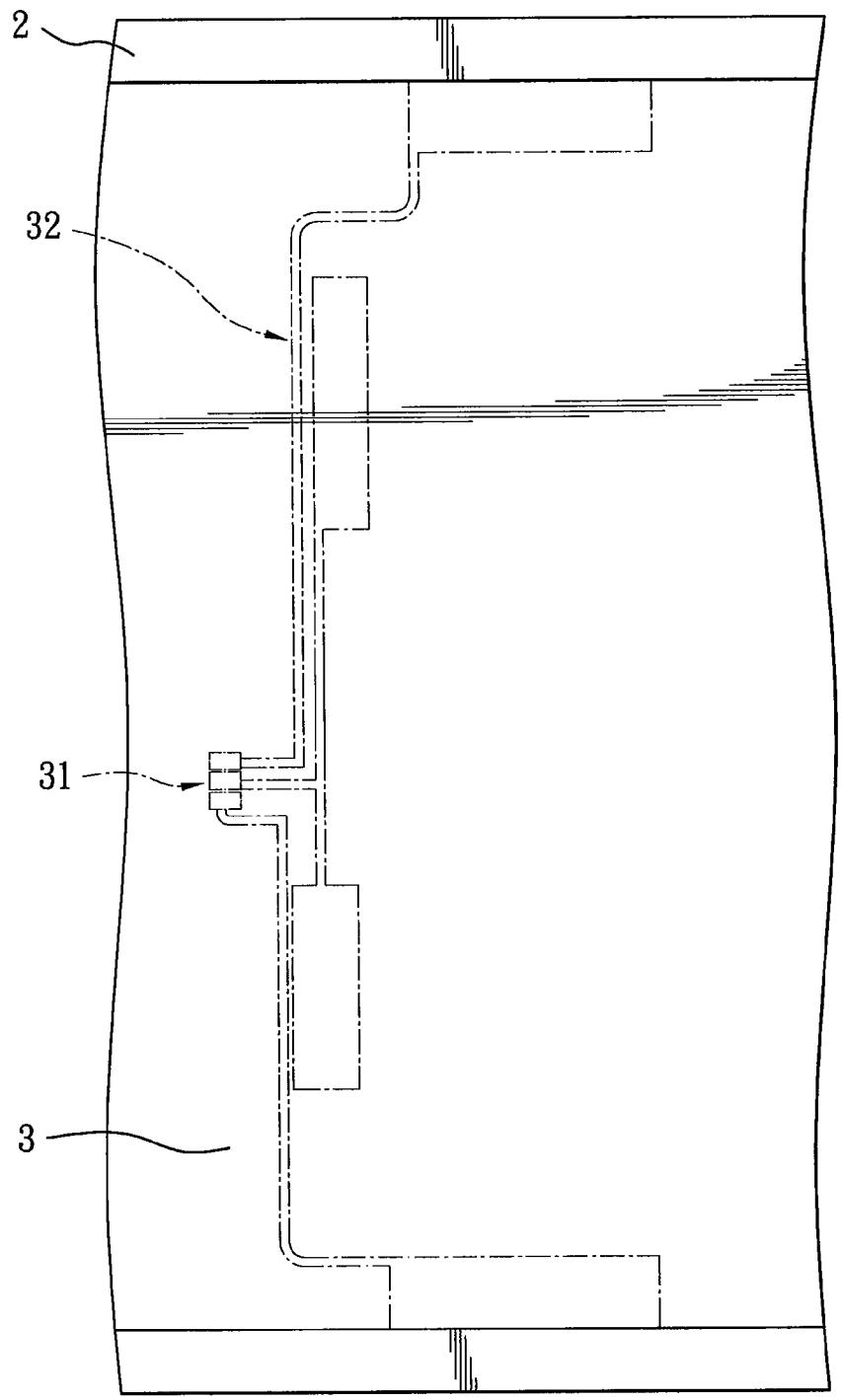
FIGS. 4 and 5 are schematic views illustrating the formation of an upper connective pad and an induced circuit pattern of the preferred embodiment.
Figure 5:
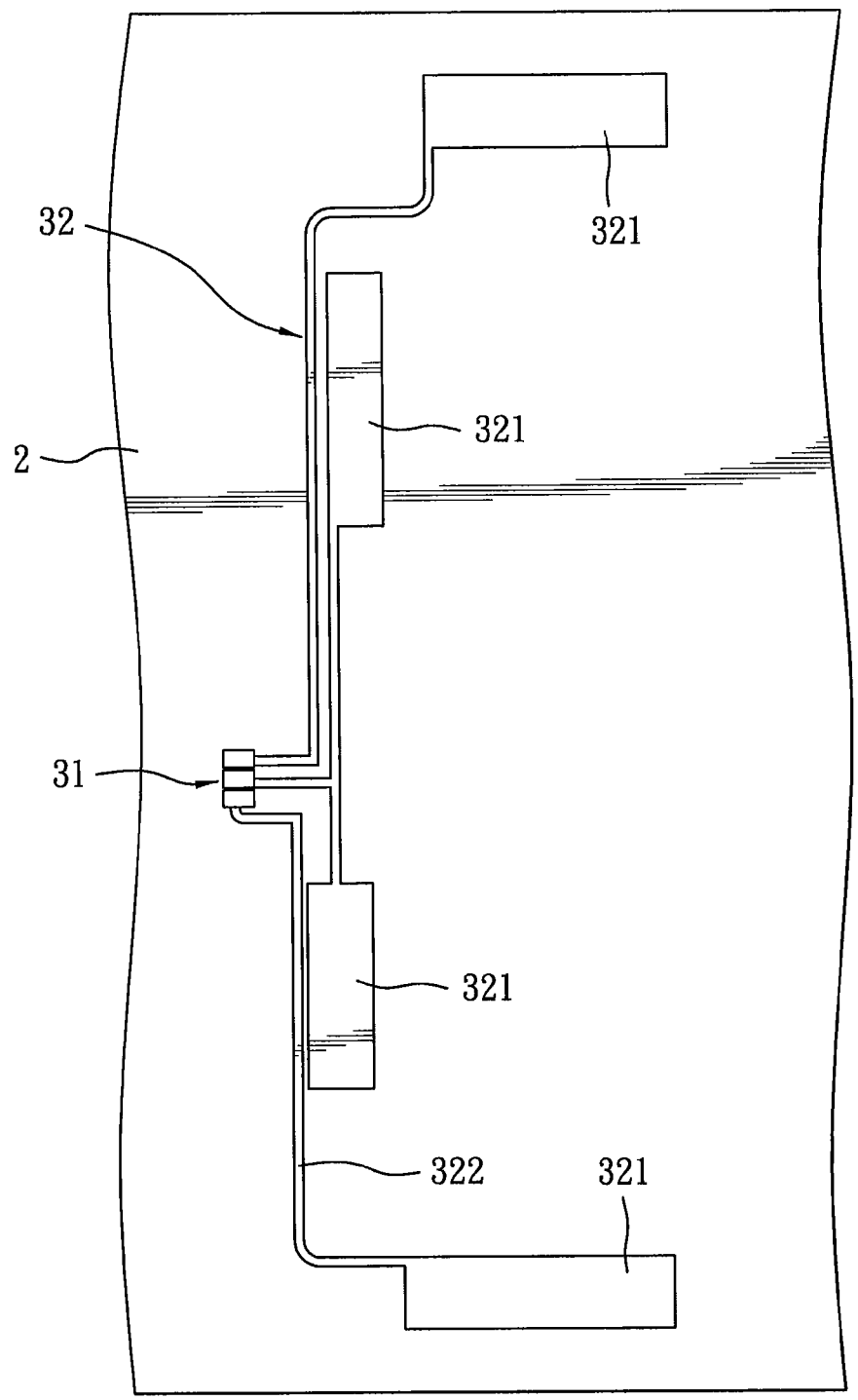

Referring further to FIGS. 4 and 5, which show only one proximity sensing module for the sake of clarity, in the step 200, an upper conductive film 3 is adhered to and covers the lower connective pads 11 and the release sheet 2 by virtue of a conductive adhesive and a laminating machine. The upper connective film 3 and the lower connective pad 11 are then stamped by a press machine, followed by removing an undesired part of the upper conductive film 3 and the lower connective pad 11. Therefore, the upper conductive film 3 is patterned into a patterned conductive film 30 including an upper connective pad 31 and an induced circuit pattern 32. The upper connective pad 31 is formed at a position corresponding to the lower connective pad 11. The lower connective pad 11 is patterned into a shape corresponding to an outline of the upper connective pad 31. The upper connective pad 31 and the lower connective pad 11 define cooperatively at least one contact (three contacts in this embodiment) that is adapted to be electrically connected to a contact on the circuit board of the mobile device. The contact composed of the upper connective pad 31 and the lower connective pad 11 is a two-layer conductive foil. Therefore, the mechanical strength of the contact can be increased. Moreover, in view of the two-layer structure, the contact is relatively protruded from the inner surface of the housing 7 of the mobile device upon assembling, thereby facilitating contact with the respective contact of the circuit board. Alternatively, the lower connective pad 11 may be dispensed with and the contact of the proximity sensing module is merely composed of the upper connective pad 31.

In this embodiment, the induced circuit pattern 32 includes a plurality of induced blocks 321, and a wire unit 322 that interconnects the induced blocks 321 and the upper connective pad 31. The shape, size and position of the induced blocks 321 may be designed to match the circuit board of the mobile device, and may be adjusted according to the actual requirement. In addition, in this embodiment, the lower conductive film 1 and the upper conductive film 3 are made of copper to obtain an improved electrical conductive property. However, the lower conductive film 1 and the upper conductive film 3 may also be made of any other conductive material.

Figure 6:
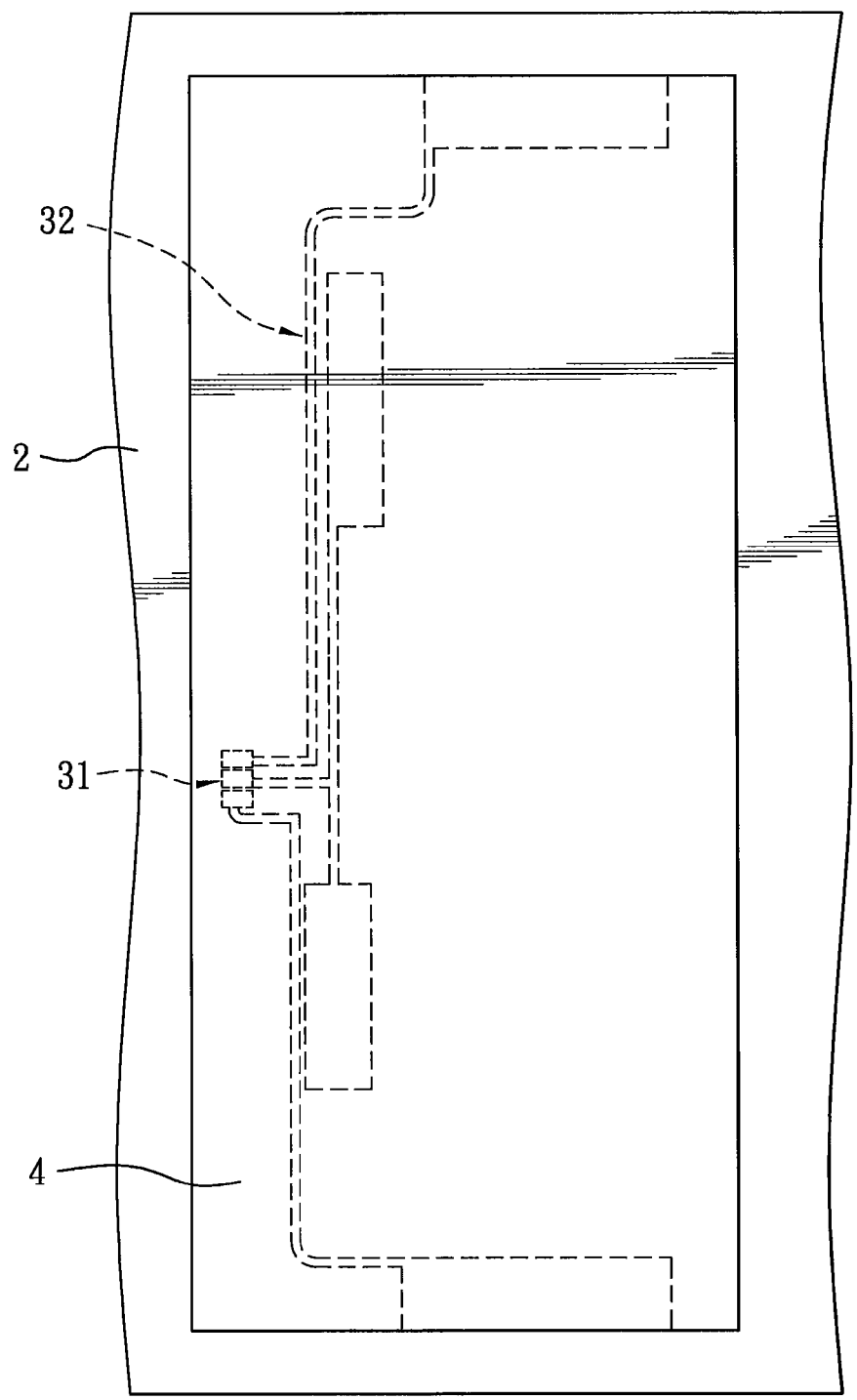
FIG. 6 is a schematic view illustrating the coverage of an adhesive sheet of the preferred embodiment.

Referring to FIG. 6, in the step 300, an adhesive sheet 4 is adhered to the patterned conductive film 30. The adhesive sheet 4 has an area capable of covering the upper connective pad 31 and the induced circuit pattern 32. The adhesive sheet 4 is also adhered to the release sheet 2 exposed from the patterned conductive film 30.

Figure 7:
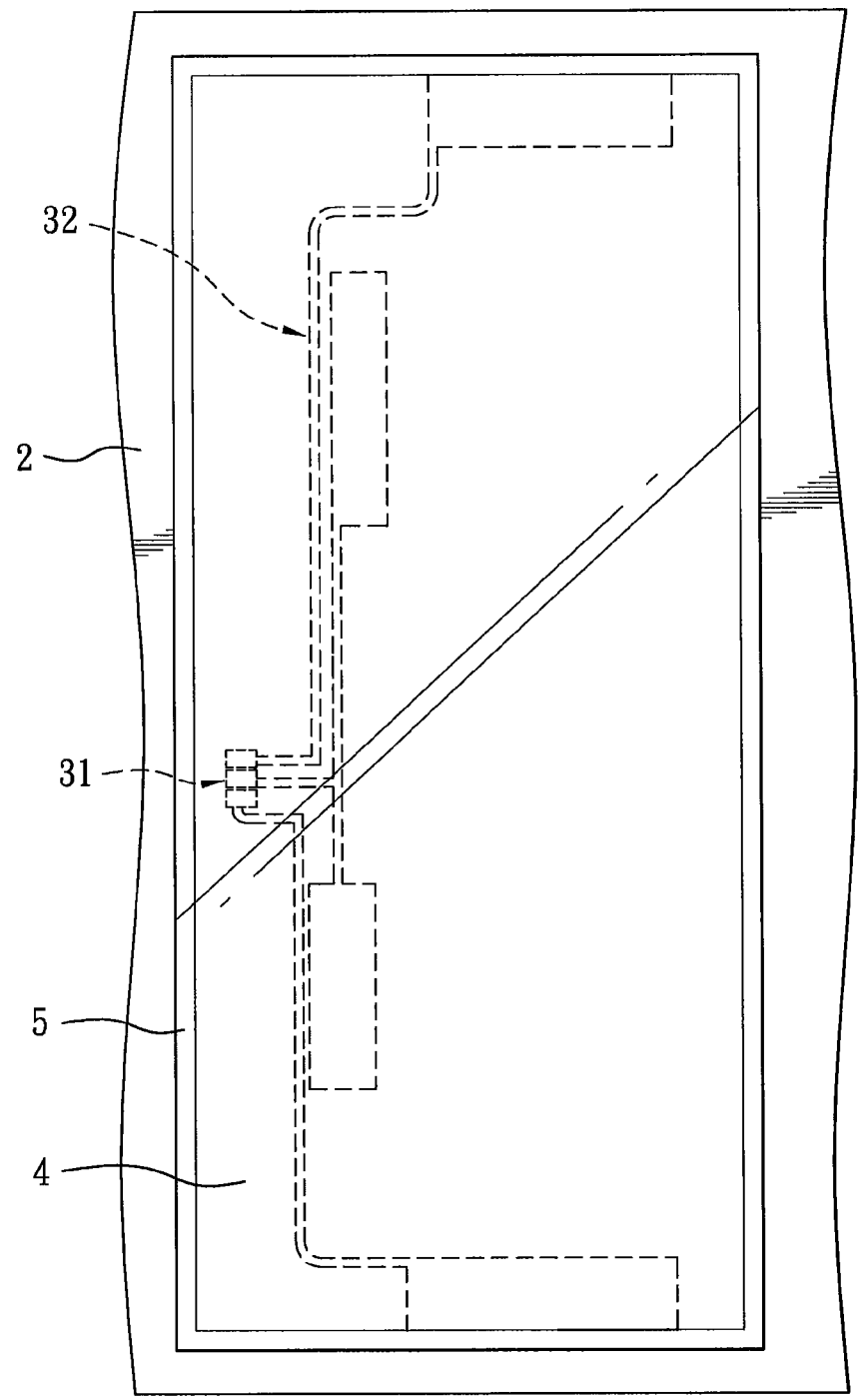
FIG. 7 is a schematic view illustrating the coverage of a protective film of the preferred embodiment.

Referring to FIG. 7, in the step 400, a protective film 5 is formed on a surface of the adhesive sheet 4 opposite to the patterned conductive film 30. The protective film 5 may also be first adhered to an opposite surface of the adhesive sheet 4 that is opposite to the surface of the adhesive sheet 4 and then adhered to the release sheet 2, the upper connective pad 31 and the induced circuit pattern 32.

Figure 8:
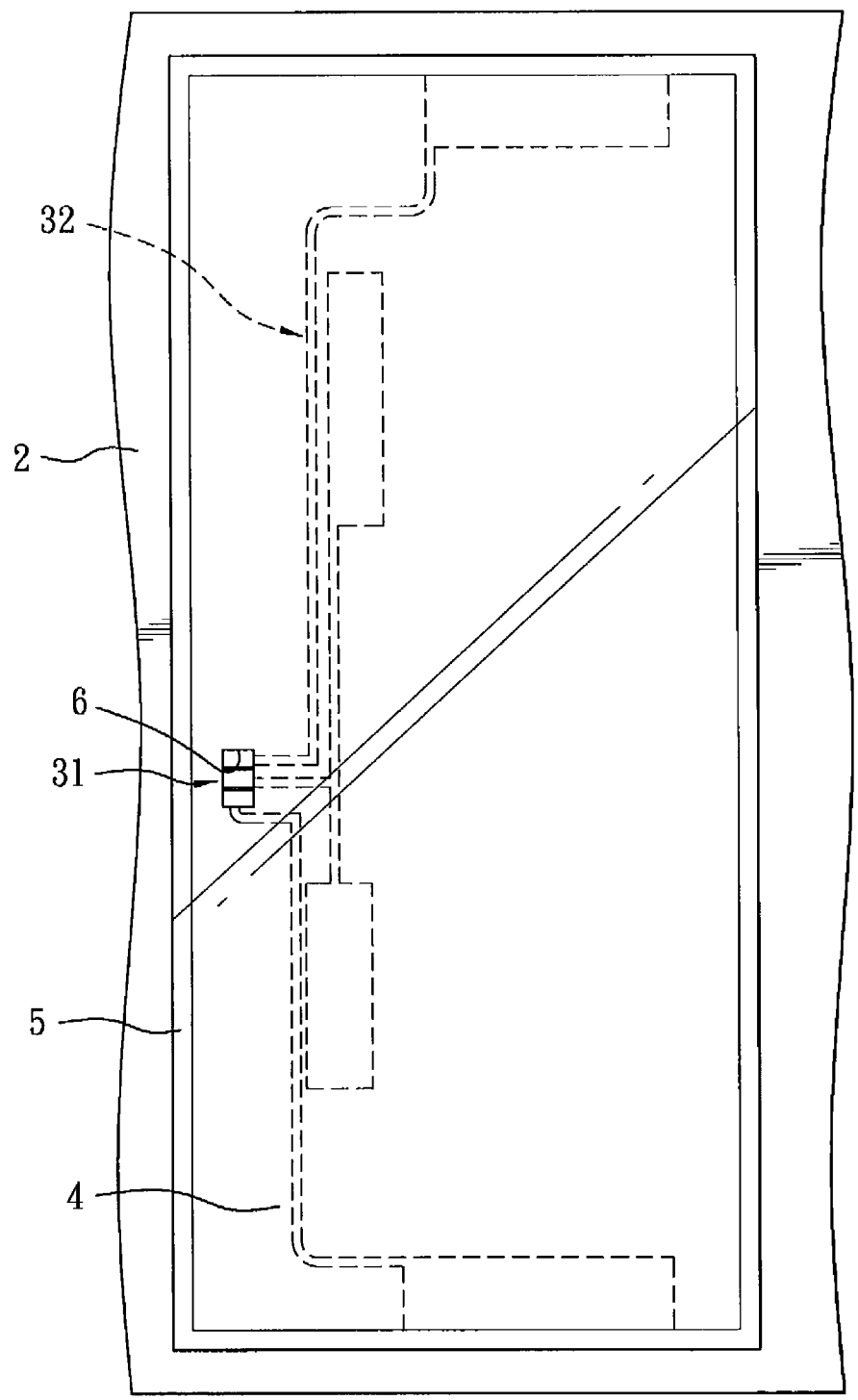
FIG. 8 is a schematic view illustrating the formation of a through hole in the adhesive sheet and the protective film of the preferred embodiment.

Referring to FIG. 8, the adhesive sheet 4 and the protective film 5 are stamped to form first and second through holes 6 that are aligned with each other and that correspond in position to the upper connective pad 31 such that the upper connective pad 31 is exposed from the first and second through holes 6. In this embodiment, the adhesive sheet 4 is a product (model no. 1683) purchased from 3M Company, which has two adhesive sides and which is soft. The protective film 5 used to cover the adhesive sheet 4 is made of a PET material to enhance the rigidity of the overall structure of the contact of the proximity sensing module. In this manner, the resultant proximity sensing module can be easily attached to the inner surface of the housing 7 of the mobile device. When a more rigid adhesive sheet 4 is used and the adhesive is only applied on the upper connective pad 31 and the induced circuit pattern 32, the protective film 5 can be dispensed with.

Figure 9:
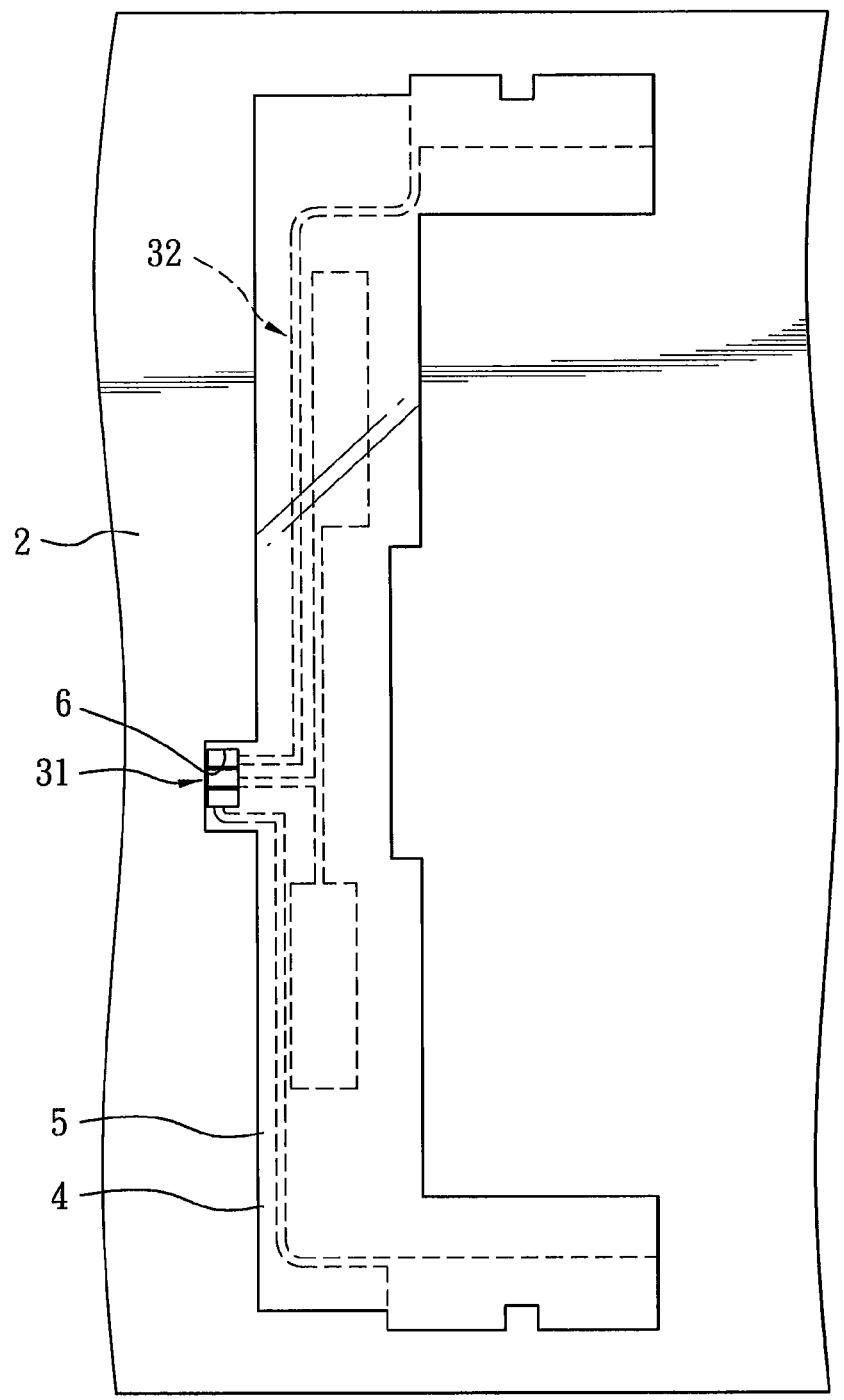
FIG. 9 is a schematic view illustrating the removal of a non-essential part of the preferred embodiment.

Referring to FIG. 9, the adhesive sheet 4 and the protective film 5 are further stamped to define the outline of the proximity sensing module, followed by removing a non-essential part of each of the adhesive sheet 4 and the protective film 5 to reduce the volume and the weight of the proximity sensing module. Finally, a proximity sensing module is obtained.

Figure 10:
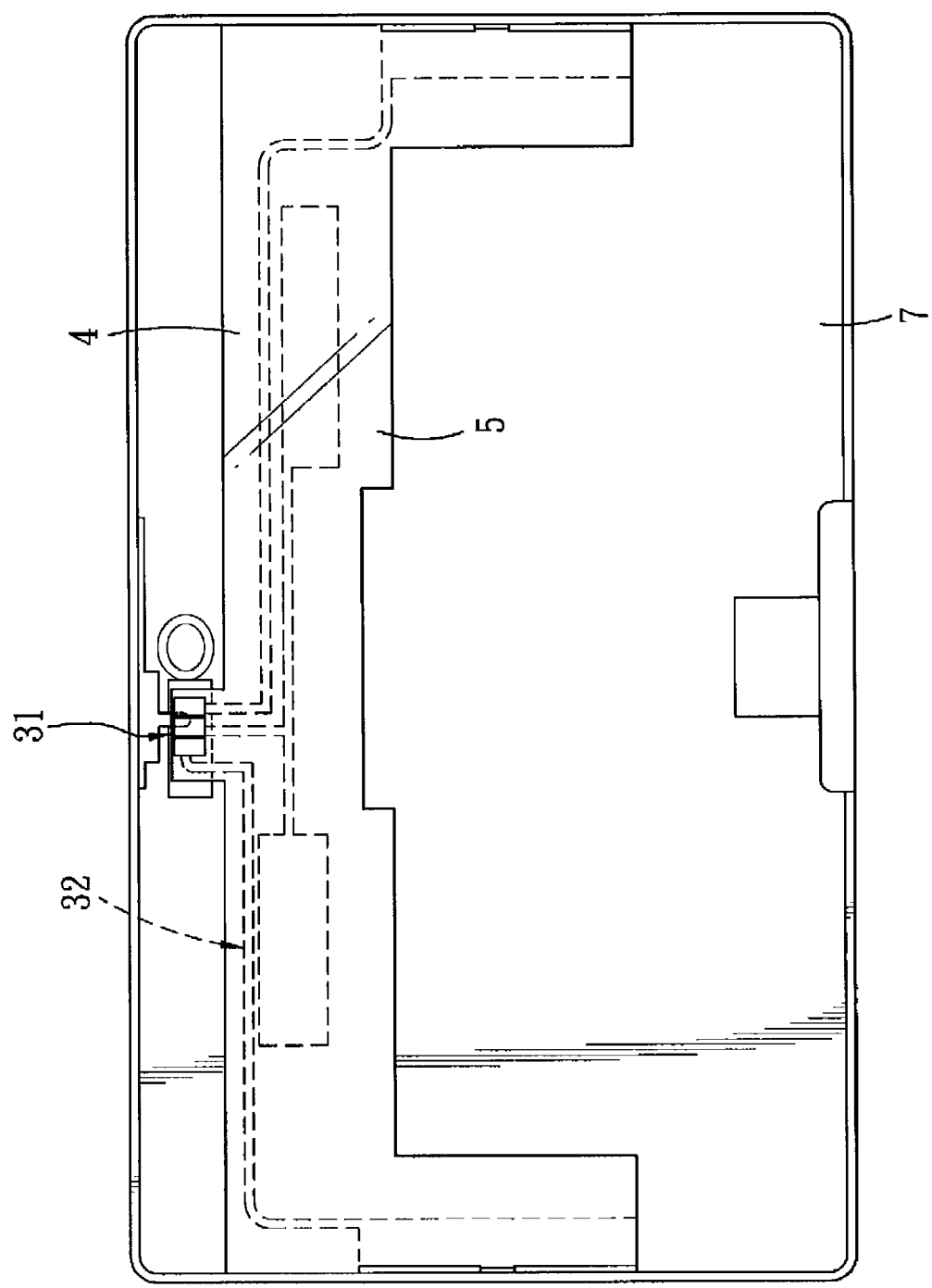
FIG. 10 is a schematic view illustrating the mounting of the proximity sensing module made from the preferred embodiment of this invention on an inner surface of a housing of a mobile device.

Referring to FIG. 10, since the adhesive is applied to the lower connective pad 11 and the induced circuit pattern 32, and the adhesive sheet 4 exhibits adhesion property, the proximity sensing module can be attached to the inner surface of the housing 7 simply by removing the release sheet 2. Therefore, the assembly process is simple and easy. In addition, since the adhesive sheet 4 and the protective film 5 cover the induced circuit pattern 32 and since only the upper connective pad 31 is exposed for contact with the contact of the circuit board, the induced circuit pattern 32 can be protected from being damaged due to an external force.

Since the proximity sensing module of this preferred embodiment is formed mainly by laminating the upper conductive film 3, the adhesive sheet 4 and the protective film 5, the manufacturing process is simple and the material selection is more flexible. Therefore, the process time and the manufacturing cost can be dramatically reduced. In addition, the proximity sensing module has a thin profile and is lightweight.

Besides, since the proximity sensing module and the circuit board can be fabricated separately, the designer has more flexibility in designing the circuit board and the induced circuit pattern 32 of the proximity sensing module.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

What is claimed is:

1. A method for fabricating a proximity sensing module that is adapted to be attached to an inner surface of a housing of a mobile device, the method comprising:
   adhering a lower conductive film to a release sheet;
   patterning the lower conductive film into a lower connective pad after the adhering the lower conductive film;
   patterning an upper conductive film to form a patterned conductive film after the patterning the lower conductive film, the patterned conductive film including an upper connective pad that is adapted to be electrically connected to a respective contact on a circuit board of the mobile device, and an induced circuit pattern that is electrically connected to the upper connective pad, wherein the upper conductive film is formed to cover the lower connective pad, and the upper connective pad is formed at a position corresponding to the lower connective pad and while patterning the upper conductive film, the lower connective pad is patterned into a shape corresponding to an outline of the upper connective pad;
   adhering an adhesive sheet to the patterned conductive film, the adhesive sheet having an area capable of covering the upper connective pad and the induced circuit pattern;
   forming a first through hole in the adhesive sheet such that the upper connective pad is exposed from the first through hole.

2. The method of claim 1, further comprising adhering the upper conductive film to the release sheet before the patterning the upper conductive film.

3. The method of claim 2, wherein the adhesive sheet is also adhered to the release sheet exposed from the patterned conductive film.

4. The method of claim 2, wherein the step of patterning the upper conductive film is conducted by stamping the upper conductive film, followed by removing an undesired part of the upper conductive film.

5. The method of claim 1, wherein the adhesive sheet is also adhered to the release sheet exposed from the patterned conductive film.

6. The method of claim 1, wherein the step of patterning the lower conductive film is conducted by stamping the lower conductive film, followed by removing an undesired part of the lower conductive film.

7. The method of claim 1, further comprising:
   forming a protective film on a surface of the adhesive sheet opposite to the patterned conductive film; and
   forming a second through hole in the protective film to align with the first through hole such that the upper connective pad is exposed from the first and second through holes.

8. The method of claim 7, further comprising:
   removing a non-essential part of each of the adhesive sheet and the protective film.

9. The method of claim 1, wherein the induced circuit pattern includes a plurality of induced blocks, and a wire unit that interconnects the induced blocks and the upper connective pad.

10. The method of claim 1, wherein the upper conductive film is made of copper.

* * * * *